United States Patent [19]

White et al.

[11] 4,121,113

[45] Oct. 17, 1978

[54] ELECTRIC SWITCH

[75] Inventors: Robert Edward White, Aloha; David Edward Moeckli, Beaverton, both of Oreg.

[73] Assignee: Tektronix, Inc., Beaverton, Oreg.

[21] Appl. No.: 786,000

[22] Filed: Apr. 11, 1977

[51] Int. Cl.$^2$ .............................................. H01H 9/54
[52] U.S. Cl. ...................................... 307/140; 323/19
[58] Field of Search .............. 307/112, 113, 114, 115, 307/116, 117, 118, 119, 252 B, 140; 361/100; 340/147 R; 323/19, 24, 34

[56] References Cited

U.S. PATENT DOCUMENTS

| | | | |
|---|---|---|---|
| 3,287,571 | 11/1966 | White | 323/24 |
| 3,665,219 | 5/1972 | Teske | 307/252 B |
| 3,723,769 | 3/1973 | Collins | 307/252 B |
| 3,892,981 | 7/1975 | Bauer | 307/117 |

Primary Examiner—Gene Z. Rubinson
Assistant Examiner—Morris Ginsburg
Attorney, Agent, or Firm—Adrian J. La Rue

[57] ABSTRACT

An electrical switch which can be remotely conditioned to an ON state or an OFF state for controlling the energization of a load with a single isolating component providing both control and power functions.

3 Claims, 1 Drawing Figure

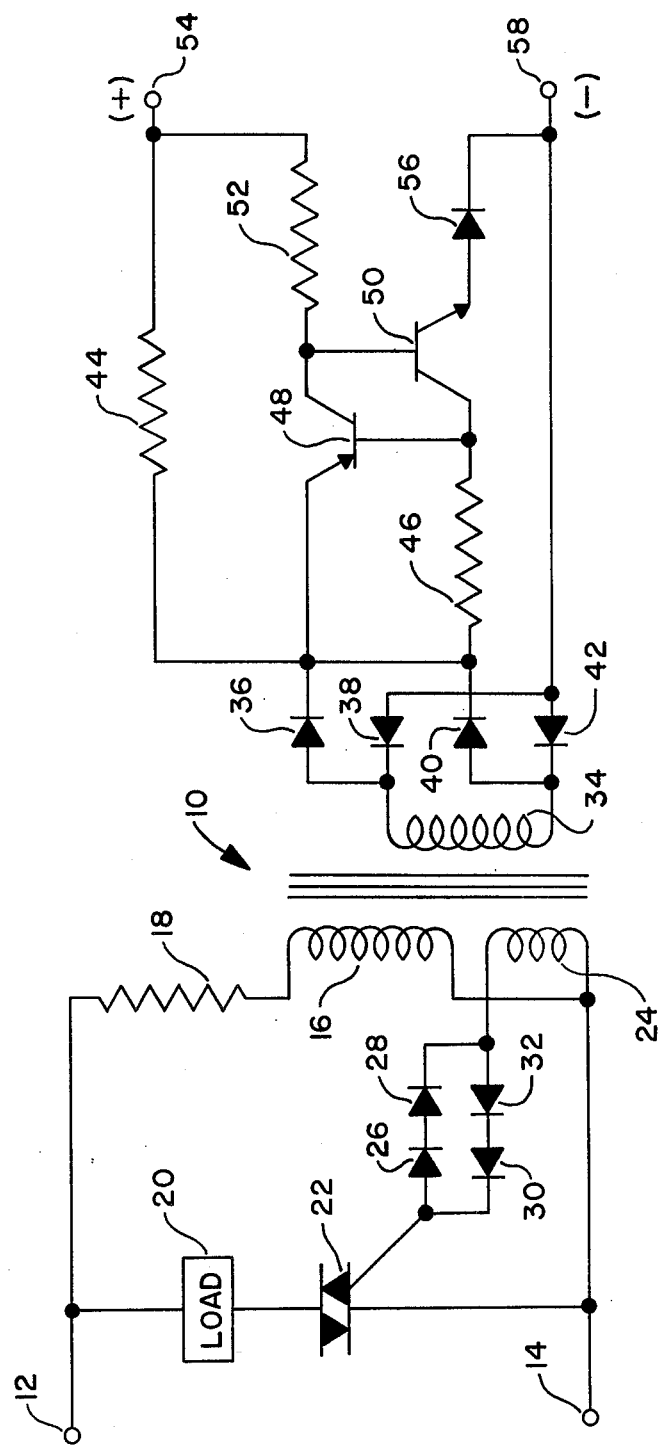

ELECTRIC SWITCH

BACKGROUND OF INVENTION

Prior art applications of controlling the energization of a load have included a triac or bilateral triode switch device which can be made to conduct on both alternations of an AC voltage. In such applications, trigger circuits are provided for the triac which must be triggered into conduction. As an example, in U.S. Pat. No. 3,665,219, there is described an AC semiconductor switch for controlling the energization of a load from a relatively high voltage source which is controlled by signal pulses supplied to the semiconductor from a circuit connected to a relatively low voltage source. Such teachings, however, have the disadvantage that a separate DC voltage source must be provided to the signal producing circuit. This additional DC voltage source tends to degrade the power control due to the cost, reliability and weight associated therewith.

In addition to the above-described disadvantages of the prior art, circuits have been developed to control the energization of a load using techniques such as optical isolation of the trigger signal and the concept of zerocross triggering to improve radiated noise and reduce surge current, for an example, as the circuit described in U.S. Pat. No. 3,723,769. Here again, external DC sources have been utilized.

SUMMARY OF INVENTION

Accordingly, the present invention is directed to an electrical switch which can be remotely conditioned to an ON or OFF state for controlling the energization of a load and which does not require additional external sources of power. More specifically, the circuit provides not only the activation of power to a load but, in addition, provides isolation of the line and activator, switching that is logic compatible, and reduced turn on power surge and yet requires no power from the input activator.

It is therefore an object of the present invention to provide an electrical switch which overcomes the disadvantages of the prior art.

It is another object of the present invention to provide a circuit for the activation of power to a load which provides isolation of the power source and activator, switching that is logic compatable, and reduced turn on power surge without requiring power from the input activator.

It is yet another object of the present invention to provide an electric switch which is remotely operated.

The foregoing and numerous other objects, advantages, and inherent functions of the present invention will become apparent as the same is more fully understood from the following description and single drawing which describes one preferred embodiment of the invention; it is to be understood, however, that the embodiment is not intended to be exhausting nor limiting of the invention but is given for purposes of illustration in order that others skilled in the art may fully understand the invention and principles thereof and the method of applying it in practical use so that they may modify it in various forms, each as may best be suited to the conditions of the particular use.

DESCRIPTION OF DRAWINGS

The single FIGURE of the drawing is a schematic diagram of an electrical switch in accordance with one preferred embodiment of the present invention.

DESCRIPTION OF INVENTION

Referring to the single FIGURE, it is seen that the switch according to the present invention includes a transformer 10, such transformer being utilized to provide operating power to a control source ordinarily requiring a separate source of power, as well as isolating such control source from a source of electrical energy applied to the switch via input terminals 12 and 14. This electrical energy is coupled to a first winding 16 of transformer 10 via a series connected resistor 18. Resistor 18 can, of course, be of such value to enable, for example, a conventional 115 volt, 60 Hertz waveform to be the source of electrical energy, or it may be of different value to enable a conventional 230 volt, 60 Hertz waveform to be the source of electrical energy. Disposed in parallel with first winding 16 and the limiting resistor 18 is a load 20 and series connected TRIAC 22. It is the load 20 that the electrical switch according to the present invention is remotely conditioned to control. This load may be, for example, a variety of electronic or electric equipment which requires energization from an AC voltage waveform of the power lines.

The TRIAC 22, which is a conventional three terminal switch that can be triggered with either positive or negative gate pulses when the anode potentials are positive or negative, respectively (see "Integrated Electronics: Analog and Digital Circuits and Systems" by J. Millman and C. Halkias, copyright 1972 by McGraw-Hill, Inc.), has its gate terminal coupled to a second winding 24 of transformer 10 via a plurality of diode pairs 26–28 and 30–32. It should be mentioned that the diodes 26, 28, 30 and 32 are utilized to insure the gate characteristics of the TRIAC are fully anticipated, and could be eliminated entirely or require additional ones depending upon the voltage turn on (activation) specification of the selected TRIAC.

Before continuing, it should be mentioned that transformer 10 is preferrably a transformer having a second winding 24 with fewer turns that the first winding 16 to provide a current-step-up for driving the TRIAC gate. In addition, transformer 10 preferrably provides the dielectric withstand as required by IEC and UL ratings for line isolation between primary and secondary.

A third winding 34 of transformer 10 is provided for delivering to the control source the energy transferred across the transformer. Such energy is firstly applied to a plurality of diodes 36, 38, 40 and 42. These diodes are conventionally connected so as to treat the energy transferred across the transformer to the advantages of full wave rectification. Coupled between the diodes 36, 40 and 38, 42 is a series connected circuit comprising a resistor 44, a resistor 52, the base-emitter junction of a first transistor 50 which is preferrably on the NPN type, and a diode 56. The junctions formed by the connection of the resistors 44, 52 and the connection of the diode 56 to diodes 38, 42 respectively, are provided with terminals 54 and 58 with polarity as shown. These terminals are provided as logic compatible inputs for logical circuits such as TTL, RTL, DTL, MOS, CMOS, Reed Relays, switches, Optoisolators, etc. and will be discussed elsewhere in the description.

The circuit additionally consists of a second transistor 48 which is preferrably of the PNP type, having its emitter-collector junction disposed between the diodes 36, 40 and the junction formed by the connection of the resistor 52 and the base of first transistor 50. The base of this second transistor 48 is directly coupled to the collector of first transistor 50 and also coupled to the diodes 36, 40 via a base-emitter resistor 46. Although not shown in the drawings, each transistor may have a capacitor disposed across its base-emitter for noise suppression purposes.

Before considering the operation of the switch, while applicants do not wish to be limited to any particular set of values, the following values for the components have proved useful in one embodiment of the described invention:

| | |
|---|---|
| Resistor 18 | 10KΩ, 3 Watt at 110V; 20KΩ 6 Watt at 230V |
| Resistor 44 | 100KΩ, ½ Watt |
| Resistor 46 | 4.7KΩ, ½ Watt |
| Resistor 52 | 6.2KΩ, ½ Watt |
| TRIAC 22 | General Electric SC141D |
| Diodes 26,28,30,32,56 | 1N4152 |
| Diodes 36,38,40,42 | 1N4610 |
| Transistor 48 | 2N3906 |
| Transistor 50 | 2N3904 |
| Transformer 10 | Winding 16 – 3000 turns #42 |
| | Winding 24 – 300 turns #33 |
| | Winding 34 – 3000 turns #42 |
| | Core – EI-25 |

Operation of the circuit will now be considered. Assuming that terminals 54 and 58 are as shown in the drawings and that an AC source of power is instantaneously applied between the pair of power terminals 12, 14, there will exist the beginning of a pulsating of half-sinusoid at the output of the bridge rectifier comprising the already mentioned diodes 36, 38, 40 and 42. This causes a current to flow via resistor 44, resistor 52, and the base-emitter junction of transistor 50 which is returned to the bridge via the diode 56. Transistor 50 is therefore biased into conduction which, in turn, turns on transistor 48. With transistors 48 and 50 both conducting, the voltage across winding 34 is clamped. Due to transformer action, the winding 24 is also clamped but the level of clamping is not sufficient (voltage) to activate TRIAC 22 into conduction. Consequently, the load 20 is not energized.

In this mode of operation, auxilary features of the present invention exist. As has been previously stated, the voltage across terminals 54, 58 is logic compatible with TTL, RTL, DTL, MOS, CMOS, Reed Relay, Switch, Optoisolators, and is available since the diode 56 is a level shifting diode to make the control voltage logic compatable. This diode could be eliminated for some logic types.

Continuing, assume now that some means were provided whereby the terminals 54 and 58 would be remotely controlled, say, by a simple mechanical switch coupled between the terminals and manually switched to short the terminals. Another example would be a computer or the like, so that terminals 54 and 58 become electrically connected together. This could be a normally non-conductive transistor whose collector-emitter junctions were appropriately disposed between the subject terminals and where the base thereof was controlled by a control voltage obtained from a computer to render the transistor conductive for certain periods of time to thereby short the terminals together.

With the terminals 54 and 58 electrically connected together, the transistors 48 and 50 continue to conduct until the next zero crossing of the applied AC source of power. With such zero crossing, transistors 48 and 50 lose the necessary substaining current and switch to the non-conductive state. Instantly, the output of the transformer produces a normal-sinusoid voltage which is transfered via winding 24 to gate the control terminal of TRIAC 22 so that TRIAC 22 conducts thereby completing the series circuit. Consequently, the AC source of power applied across power terminal 12, 14 now energizes the load. As long as the terminal 54 and 58 remain electrically connected together, the SCR like switch is off and the load remains energized. In addition, the voltage at the output of the bridge rectifier could be utilized for power startup or sensing applications.

Therefore, the present invention provides an electrical switch for controlling the energization of load 20 which comprises a pair of power terminals 12, 14 which are connectable to the load for receiving an AC source of power, a switch 22 connected in series with the load with the switch having a control terminal which is selectively controlled to cause the load to be conditioned to either an ON or OFF state, and a control means which is isolatively coupled to the power terminal and to the TRIAC 22 which includes a means for activating the control means which, in turn, provides a control signal to control the energization of the load by controlling the conduction of the TRIAC 22.

While there has been shown and described the preferred embodiment of the present invention, it will be apparent to those skilled in the art that changes and modifications may be made without departing from the invention in its broader aspects. For example, it would be possible to utilize an activator means so that the winding 34 is directly shorted thereby eliminating the necessity of the bridge, SCR operated switch, etc. Therefore, the appended claims are intended to cover all such modifications that fall within the true spirit and scope of the invention.

The invention is claimed in accordance with the following:

1. A remotely activated electrical control circuit for applying power to a load, the circuit comprising:
   switch means connected to an alternating current power supply and in series with the load for switching power to the load;
   control means for controlling the conduction and non-conduction of said switch means, said control means being isolatively coupled to said alternating current power supply and said switch means;
   said control means includes a transformer with a first winding for applying a control voltage to said switch means for turning it on and off and also includes a control section for selectively shorting a second winding of said transformer; and
   said control section includes a full-wave rectifier connected between the output terminals of said second winding of said transformer for providing a DC voltage to activate said control means.

2. The electrical control circuit according to claim 1 wherein said control means is deactivated by shorting said output terminals of said second winding of said transformer.

3. The electrical control circuit according to claim 2 wherein said control section includes:

a first transistor having the emitter connected to one terminal of said full-wave rectifier;

a second transistor of opposite conductivity to said first transistor having the collector, base, and emitter thereof connected to the base and collector of said first transistor and the other terminal of said full-wave rectifier, respectively;

first and second resistors connected in series with each other between said one terminal of said full-wave rectifier and the collector of said first transistor; and external means for electrically connecting or disconnecting the junction point of said first and second resistors to said other terminal of said full-wave rectifier, thus shorting the output terminals of said second winding of said transformer.

* * * * *